(12) United States Patent
Levin et al.

(10) Patent No.: US 7,116,094 B2
(45) Date of Patent: Oct. 3, 2006

(54) APPARATUS AND METHOD FOR TRANSMISSION AND REMOTE SENSING OF SIGNALS FROM INTEGRATED CIRCUIT DEVICES

(75) Inventors: Theodore M. Levin, Burlington, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 10/710,683

(22) Filed: Jul. 28, 2004

(65) Prior Publication Data
US 2006/0022671 A1   Feb. 2, 2006

(51) Int. Cl.
*G01R 15/20* (2006.01)
*G01R 1/20* (2006.01)
*G01R 15/18* (2006.01)
*G01R 33/02* (2006.01)

(52) U.S. Cl. .................. 324/117 H; 324/126; 324/127; 324/248

(58) Field of Classification Search ...................... None
See application file for complete search history.

(56) References Cited

U.S. PATENT DOCUMENTS 5,831,426 A * 11/1998 Black et al. ................ 324/127
6,043,649 A * 3/2000 Toyoda et al. .............. 324/248
6,472,878 B1 10/2002 Bruchmann
6,891,431 B1 * 5/2005 Beer et al. ...................... 330/6
2004/0263162 A1* 12/2004 Kandori et al. ............. 324/248

FOREIGN PATENT DOCUMENTS

DE   19549181   7/1997

* cited by examiner

*Primary Examiner*—Paresh Patel
*Assistant Examiner*—Roberto Velez

(57) ABSTRACT

An apparatus and a method for testing semiconductor devices, such as individual integrated circuits in semiconductor chips, by directing a current in each circuit through a respective selected predetermined path to establish, in each circuit, a respective focused magnetic field and converting each such magnetic field into a respective voltage which, when fed to respective amplifier gated with a respective selected frequency, will modulate each such respective voltage. Each such respective voltage is then used to create a respective pulsating magnetic field that when detected by a respective remote magnetic sensor will provide a series of respective signals representative of the current in the respective circuit from which the pulsating magnetic field was derived. By applying each such series of voltages to a lock-in amplifier synchronized at the respective frequencies gating each respective amplifier the current in each circuit being tested can be accurately determined and will be free of errors due to circuit noise or crosstalk between the circuits under test.

7 Claims, 4 Drawing Sheets

APPARATUS AND METHOD FOR TRANSMISSION AND REMOTE SENSING OF SIGNALS FROM INTEGRATED CIRCUIT DEVICES

BACKGROUND OF INVENTION

The present invention relates generally to an apparatus and a method for the transmission and sensing of signals in selected portions of semiconductor integrated circuits or chips containing a plurality of individual circuits therein. More particularly, the present invention is directed to a transmission and sensing circuit arrangement especially useful in measuring currents in selected portions of semiconductor Integrated circuits.

As is well known in the art, an Integrated circuit chip is comprised of a plurality of individual circuits and, as the elements forming the individual circuits in the integrated circuit chip have become smaller, each individual circuit in the chip also becomes denser causing an exponential increase especially in standby or quiescent currents in the chip and in each such individual circuit. Furthermore these increased currents contribute directly to excessive power dissipation in the chip and affects, through heating, the performance and reliability of the chip. Furthermore defective portions of integrated circuits often draw significantly increased current that can be used to identify defective portions of the integrated circuit. Therefore it is desirable, during the design and testing of an integrated circuit chip, to be able to accurately measure all such quiescent currents at numerous locations in a circuit or at different numerous locations in a plurality of different circuits throughout the chip in order to accurately measure the quiescent current in each circuit or selected portion thereof. In order to characterize and diagnose design or processing efficacy.

The prior art attempted to mitigate this problem by monitoring the current at multiple locations in such circuits while under test with built in current sensors (BICS). However, these prior art BICS have various shortcomings that adversely impact the circuits under test for they are interactive and thus introduce parasitic resistance, additional capacitance or inductance, while consuming unproductive chip area by requiring extra inputs and outputs, additional wiring, and tester hardware to transmit the current measurement data off-chip.

Accordingly, the present invention is designed to circumvent the above difficulties and avoid the above described difficulties encountered by the prior art. The present invention achieves these ends by providing a circuit layout and current-monitoring apparatus and a method that is passive, remote, has little or no parasitic electrical impact on the circuit under test, minimizes the impact on circuit layout, or area, and provides wide frequency response. The present invention also has minimal impact on circuit performance and provides analog current information from multiple locations simultaneously without crosstalk, interference, or noise.

SUMMARY OF INVENTION

The present invention achieves all of these desirable results, in a novel circuit; in which the current from a circuit under test, passing to ground, is directed through a first respective selected predetermined path and location to establish in each such circuit under test, a focused magnetic field at a known position; converting each such focused magnetic field into a respective "Hall voltage", feeding each respective Hall voltage to a respective amplifier that is strobed or gated with a respective selected frequency; to modulate, in the amplifier, the converted Hall voltage and thereby provide, at the output of said amplifier, current pulses at the frequency of said respective selected frequency; passing said current pulses through a second predetermined path to ground to establish in said second path a pulsating magnetic field; and, detecting said pulsating magnetic field with a remote magnetic sensor to provide an electrical output directly proportional to the current in said first path at the respective selected frequency.

The remote sensor is preferably a respective superconducting quantum interference device (SQUID) whose output is directed to a lock-in amplifier that is synchronized with the respective frequencies pulsing the sensed magnetic field transmitters. The present invention thus eliminates crosstalk between the individual magnetic field transmitters, noise in the form of extraneous magnetic fields, and increases the output read from each circuit under test.

The present invention also teaches a method for the remote magnetic field sensing and readout at known frequencies.

The present invention by providing each circuit under test with a first respective magnetic field concentrator arranged to determine the quiescent current in a selected portion of an integrated circuit by sensing the current therein, converting the sensed current to a Hall voltage, modulating this Hall voltage with a known frequency, amplifying the modulated voltage to create a modulated current through a second magnetic field concentrator to create a pulsating magnetic field and detecting this pulsating magnetic field with a remote sensor to provide an output signal proportional to the original sensed current.

The current in each circuit, in a plurality of integrated circuits, can be measured by using a distinct frequency for each circuit being measured to create distinct pulsed magnetic fields and distinct pulsed output signals and sending the output signal of each respective remote sensor to a lock-in amplifier that is synchronized with the frequencies used to create the pulsed magnetic fields so that the output of the lock-in amplifier provides analog current information from each sensing location without crosstalk between the sensing circuits and without noise in the form of stray extraneous magnetic fields and other induced errors in the tested circuit.

These objects, features and advantages of the present invention will become further apparent to those skilled in the art from the following detailed description taken in conjunction with the accompanying drawings wherein:

DETAILED DESCRIPTION

Figure 1:
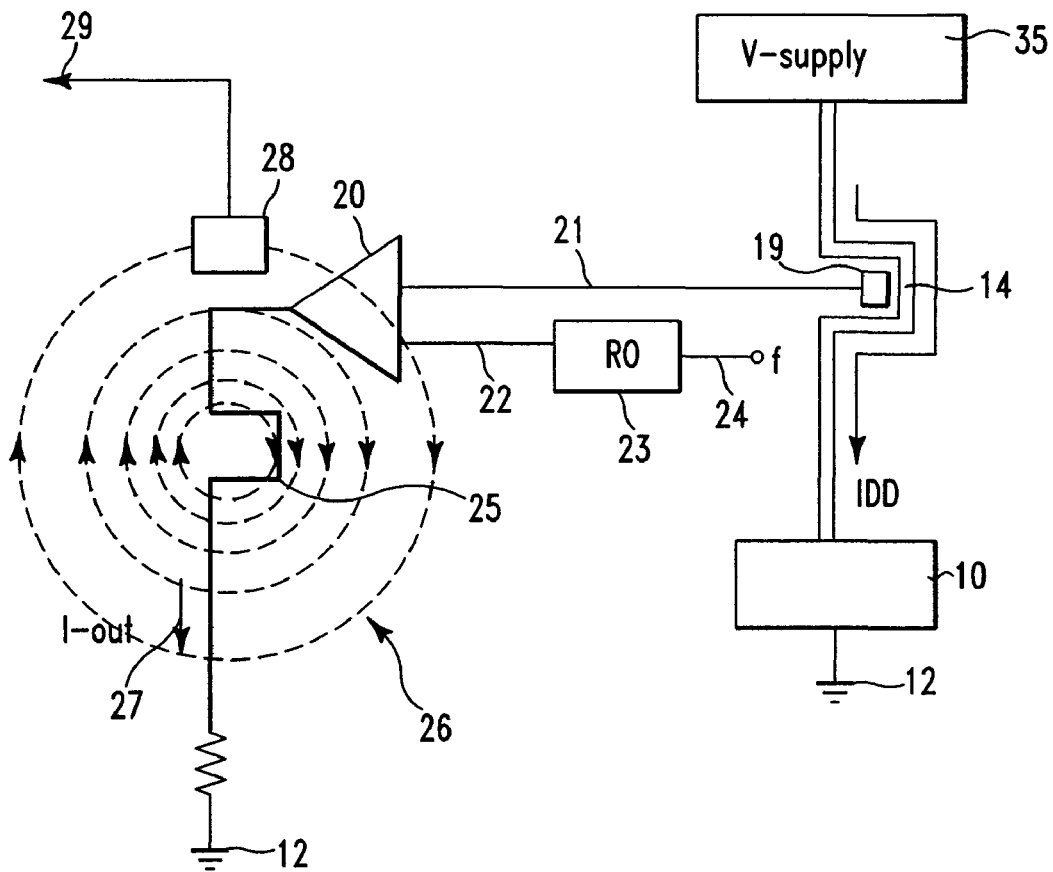
FIG. 1 is a schematic view of signal transmitter and sensor circuits of the present invention.
Figure 2:
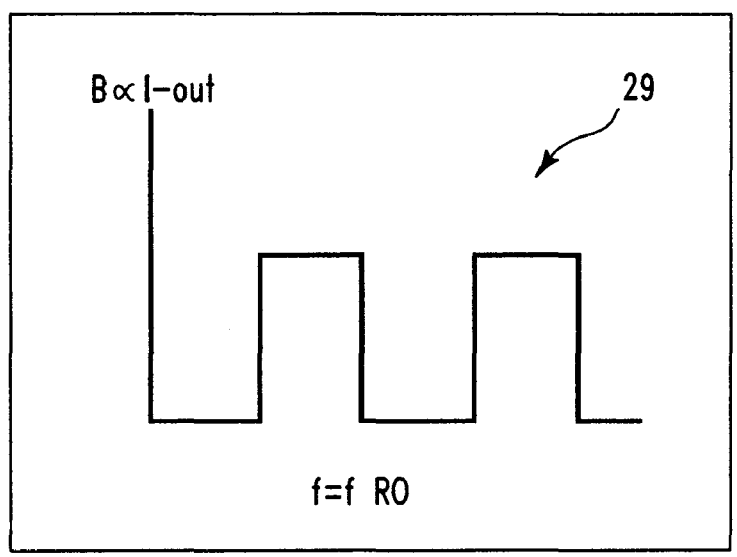
FIG. 2 illustrates the frequency modulated magnetic field realized by the remote superconducting quantum interference device of FIG. 1.
Figure 3:
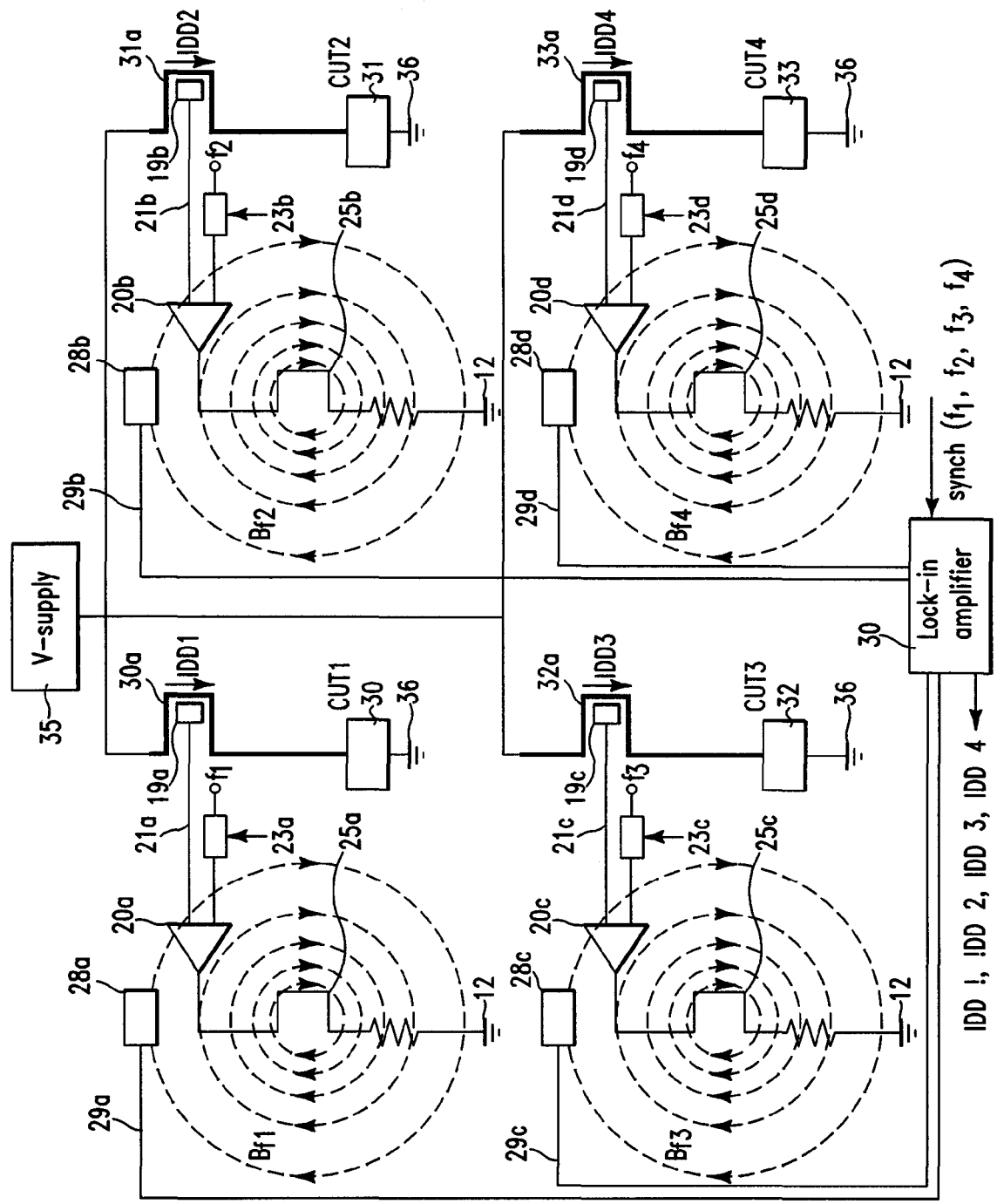
FIG. 3 schematically illustrates a chip having therein a plurality of circuits to be tested in which each circuit is provided with the present invention for determining the current in each circuit.
Figure 4:
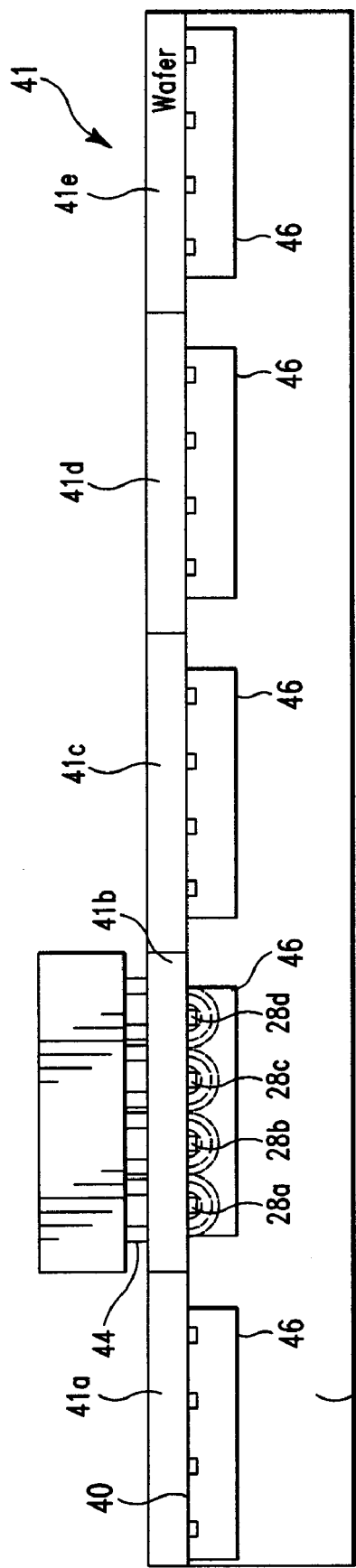
FIG. 4 is a sectional view of a schematically illustrated wafer level test assembly employing the present invention.
Figure 6:
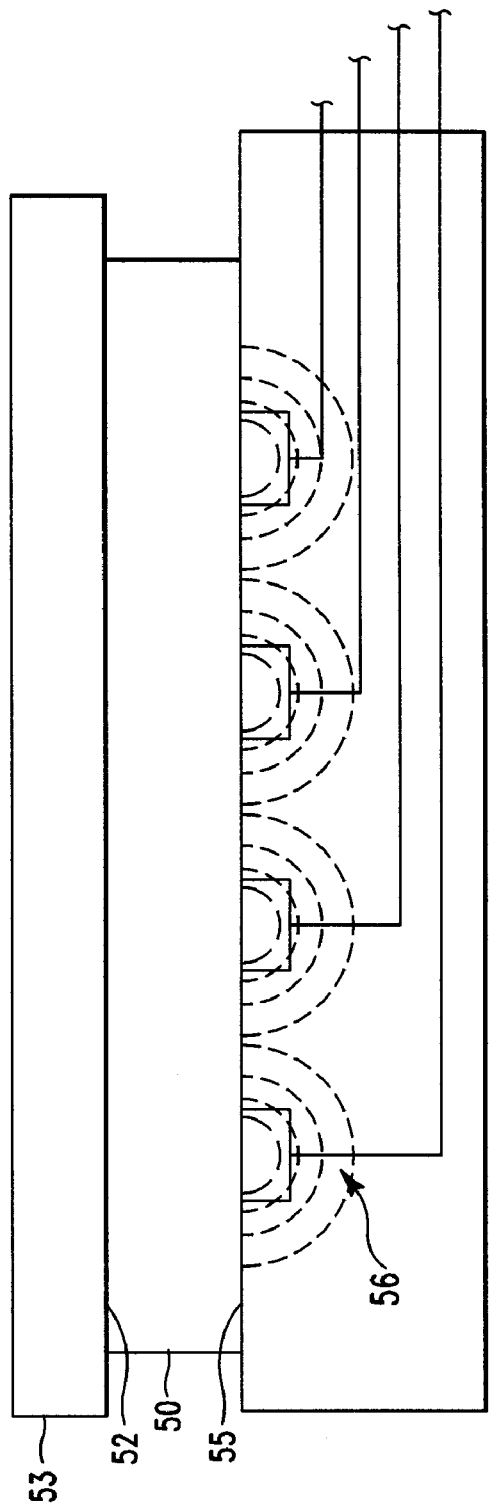
FIG. 6 is a sectional view of a schematically illustrated package level test assembly employing the present invention.
Figure 5:
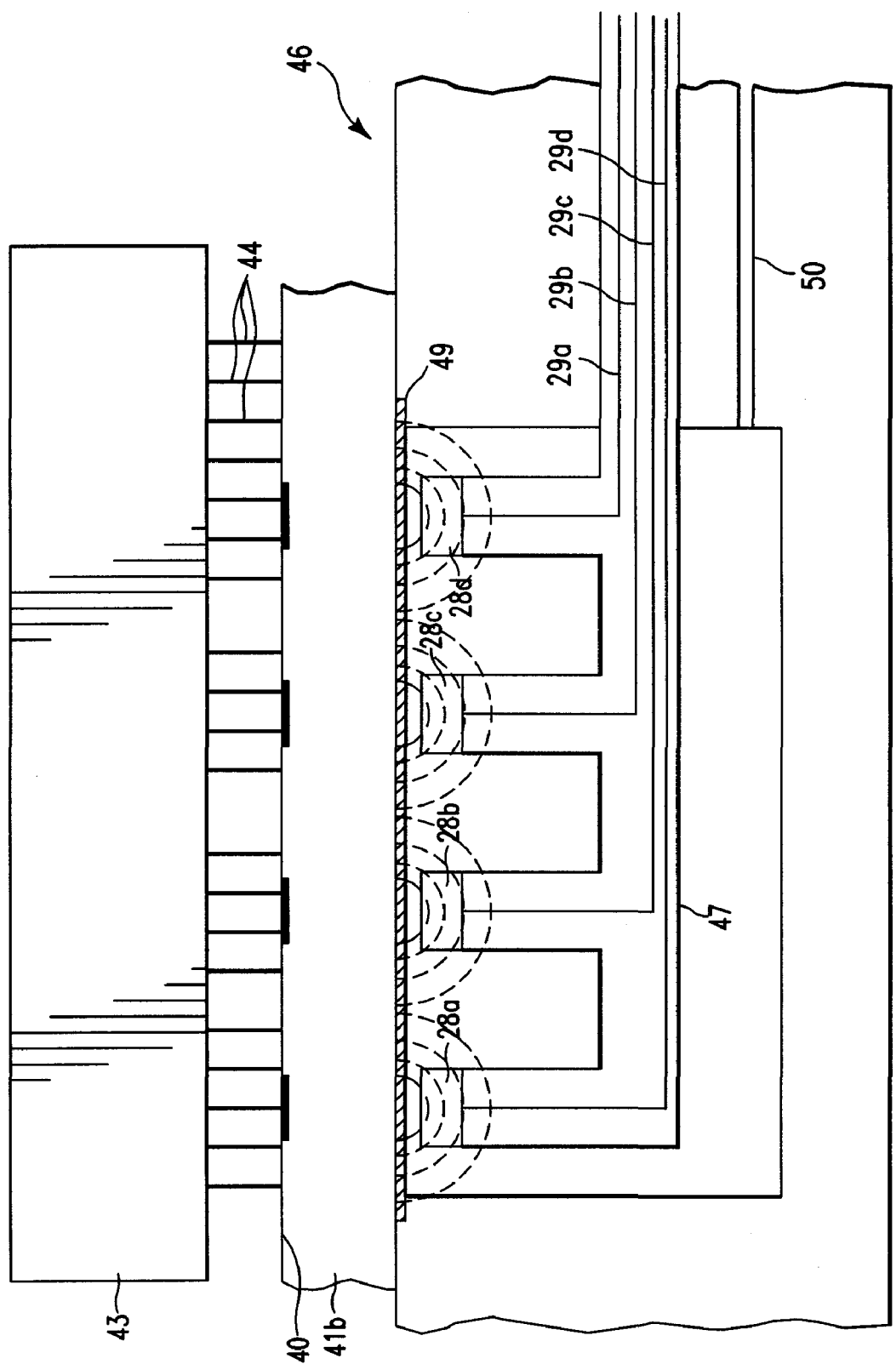
FIG. 5 schematically illustrates the housing detail of the superconducting quantum interference device used in the present invention.

Referring now to FIGS. 1 through 6 the present invention will be described in detail, wherein: FIG. 1 is a schematic view of signal transmitter and sensor circuits of the present invention; FIG. 2 illustrates the frequency modulated magnetic field realized by the remote superconducting quantum interference device of FIG. 1; FIG. 3 schematically illustrates a chip having therein a plurality of circuits to be tested in which each circuit is provided with the present invention for determining the current in each such circuit; FIG. 4 schematically illustrates a wafer level test assembly employing the present invention; FIG. 5 illustrates the housing detail of the superconducting quantum interference device used in the wafer level test assembly of FIG. 4 and FIG. 6 illustrates a package level test assembly employing the present invention.

With reference now to the drawings and especially FIGS. 1 and 2, there is schematically shown, in FIG. 1, a circuit 10 coupled between to a voltage supply 35 and ground 12 through a magnetic field concentrating loop 14. When the circuit 10 is activated it draws a current IDD from the voltage source 35 through the concentrating loop 14 and a magnetic field is generated adjacent the loop. A magnetic field sensor 19, such as a Hall Effect sensor is positioned adjacent to the concentrating loop 14 and within the generated magnetic field created by the current through the conducting loop 14. This generated magnetic field will cause the sensor.19 to produce a Hall Voltage $H_V$ that is proportional to the current through the loop 14, i.e. $V_H \propto IDD$. This generated Hall Voltage $H_V$ is fed to the first input 21 of a strobed or gated amplifier 20. Simultaneously, a selected frequency f, is delivered from the ring oscillator 23 driven by a suitable enable signal from a suitable enable signal source 24, is applied to the second input 22 of the gated amplifier 20 to create a pulsed current $I_{OUT}$ indicated by arrow 27. This pulsed current flow $I_{OUT}$ flows through a second concentrating loop 25 coupled to ground 12.and generates a strobed magnetic field 26. This strobed magnetic field 26 is now detected by SQUID 28. The SQUID 28 measures the amplitude modulated magnetic field 26 and generates the frequency modulated output signal 29 shown in FIG. 2 whose amplitude is directly proportional to the current flow $I_{DD}$ through the first concentrating loop 14.

The SQUID 28 is a commercially available device designed to measure extremely weak magnetic signals, and may be either designed for radio frequencies measurements or for direct current measurements.

Basically a SQUID is a Josephson junction device, formed of two different superconductors, e.g. a top layer formed of lead with 10% gold or indium and a bottom layer of niobium, separated by an electron tunneling barrier. Such SQUIDs are sensitive enough to detect a change of magnetic energy 100 billion times weaker than the electromagnetic energy required to move a compass needle. Because they are so sensitive they are extremely efficient remote sensors and need not come in contact with a system that they are testing.

A radio frequency SQUID is made up of a Josephson junction mounted on a superconducting ring such that when an oscillating current is applied to an external circuit, its voltage changes as an effect of the interaction between it and the ring. The magnetic flux is then measured. The direct current (DC) SQUID is much more sensitive and consists of two Josephson junctions employed in parallel so that electrons tunneling through the junctions demonstrate quantum interference, dependent upon the strength of the magnetic field within a loop and thus demonstrate resistance in response to even tiny variations in a magnetic field. This is the feature that enables the detection of such minute changes in magnetic fields.

FIG. 3 schematically illustrates a chip having therein a plurality of circuits to be tested. Each circuit employs the present invention to determine the current in each circuit. In this FIG. 3 there is shown, for example, four separate circuits 30, 31, 32, and 33 each of which is coupled to a voltage source 35, via a respective magnetic concentration loop 30a, 31a, 32a, 33a, and to ground 36. Thus when each circuit is active a respective current exists between the voltage source 35 and ground 36 via its respective concentration loop, i.e., in circuit 30 the current IDD1 passes through the loop 30a, in circuit 31 the current IDD2, passes through the loop 31a, in circuit 32 the current IDD3 passes through the loop 32a, and in circuit 33 the current IDD4 passes through the loop 33a. It is to be understood that although only four such circuits are shown in the present, that as a practical matter when testing a semiconductor chip that many different circuits or portions thereof may need to be checked and measured. Further more, the currents drawn by or existing in each circuit or portion thereof can be different from the current existing in any other circuit. Thus, during test, it is necessary to correctly establish the value of the current in each circuit or portion thereof. That is all the currents, IDD1, 1DD2, IDD3 and IDD4 need to be measured.

The present invention does so by placing a respective magnetic concentration loop 30a, 31a, 32a, and 33a in each circuit or portion whose current is to be determined and placing a respective Hall Effect sensor in each respective concentration loop. Thus, In FIG. 3, a Hall sensor 19a is placed in concentration loop 30a, sensor 19b is placed in concentration loop 31a, sensor 19c is placed in concentration loop 32a, and sensor 19d is placed in concentration loop, 33a. The signal from each respective Hall-effect device 19a, 19b, 19c, and 19d is fed to the first input of a respective gated amplifier. Thus the output of Hall-effect device 19a, is fed to the first input 21a of a respective gated amplifier 20a, the output of Hall-effect device 19b, is fed to the first input 21b of a respective gated amplifier 20b, the output of Hall-effect device 19c is fed to the first input 21c of a respective gated amplifier 20c, and the output of Hall-effect device 19d, is fed to the first input 21d of a respective gated amplifier 20d. The other input of each amplifier 20a, 20b, 20c, and 20d is coupled to a respective ring oscillator 23a, 23b, 23c, and 23d so that a respective frequency $f_1$, $f_2$, $f_3$, and $f_4$ may be generated by each respective ring oscillator into each respective amplifier 20a, 20b, 20c, and 20d. These frequencies $f_1$, $f_2$ $f_3$, and $f_4$ cause the output of each respective amplifier 20a, 20b, 20c, and 20d to pulse at the frequency applied to the amplifier. The output of each amplifier 20a, 20b, 20c, and 20d is in turn coupled to ground through a respective magnetic field concentrator 25a, 25b, 25c, and 25d to produce around each magnetic field concentrator 25a, 25b, 25c, and 25d, a respective pulsating magnetic field $B_{f1}$, $B_{f2}$, $B_{f3}$, and $B_{f4}$. Each magnetic field $B_{f1}$, $B_{f2}$, $B_{f3}$, and $B_{f4}$ is pulsating at the frequency applied to its respective amplifier. Thus the magnetic field $B_{f1}$ produced around concentrator 25a is pulsating at the frequency $f_1$, the magnetic field $B_{f2}$ produced around concentrator 25b is pulsating at the frequency $f_2$, the magnetic field $B_{f3}$ produced around concentrator 25c is pulsating at the frequency $f_3$, and the magnetic field $B_{f4}$ produced around concentrator 25d is pulsating at the frequency $f_4$. These pulsating magnetic fields $B_{f1}$, $B_{f2}$, $B_{f3}$, and $B_{f4}$ are detected by the SQUID sensors 28a, 28b, 28,c and 28d respectively. The information detected by each respective SQUID sensor 28a, 28b, 28,c and 28d is transmitted to a lock-in amplifier 30 that is synchronized with the frequencies $f_1$, $f_2$, $f_3$, and $f_4$ so that output of the lock-in amplifier 30 can be set to provide an output indicative of each respective current IDD1, 1DD2, IDD3 or IDD4.

FIG. 4 is a sectional view of a schematically illustrated wafer level test assembly employing the present invention. In FIG. 4, a wafer 41 is shown mounted on a wafer chuck 42. The wafer 41 contains a plurality of chips such as chips 41a, 41b, 41c, 41d and 41e. For purposes of illustration only it will be presumed that chip 41b contains the four separate circuits 30, 31, 32, and 33 shown in FIG. 3. The wafer 41 has its back or inactive side 40 mounted on a wafer chuck 42 containing a plurality of SQUID assemblies 28a, 28b, 28c, and 28d.

FIG. 5 is an enlargement of a portion of FIG. 4 and schematically illustrates the housing detail of the superconducting quantum interference device used in FIG. 4. Each SQUID assembly 46 is, as shown in FIG. 5 comprised of a plurality of remote SQUIDs 28a, 28b, 28c and 28d mounted in a cooling apparatus 47. Each such SQUID is of course electrically coupled, via lines 29a, 29b, 29c, and 29d to suitable circuitry (not shown) in order to determine the current in each circuit being tested and each is positioned to detect and measure a respective pulsating magnetic field. Thus SQUID 28a detects field $B_{f1}$, SQUID 28b detects field $B_{f2}$, SQUID 28c detects field $B_{f3}$ and SQUID 28d detects field $B_{f4}$. Such SQUID assemblies are presently commercially available and can be designed to conform to any desired circuit design or arrangement.

For purposes of illustration only, it will be assumed in FIGS. 4 and 5 that the magnetic concentration loops 25a, 25b, 25c and 25d are arranged in line so that a test unit 43, having a plurality of probes 44 positioned in contact with chip 41b, can provide power to the circuits 30a, 31a, 32a, and 33a in a manner well known to the art. When the circuits 30a, 31a, 32a, and 33a are powered up and operated as above described, the pulsating fields $B_{f1}$, $B_{f2}$, $B_{f3}$, and $B_{f4}$ are created. When the SQUID sensors 28a, 28b, 28c and 28d are located beneath the chip 41b as shown in FIGS. 4 and 5 each one of the pulsating fields $B_{f1}$, $B_{f2}$, $B_{f3}$, and $B_{f4}$ are detected by a respective one of the SQUID sensors 28a, 28b, 28c and 28d. Although in FIG. 5 the SQUID sensors 28a, 28b, 28c and 28d are shown mounted on cold fingers arranged in a line, it should be understood that the SQUID sensors 28a, 28b, 28c and 28d will actually be positioned in any configuration that will permit each to sense a respective one of the pulsating fields Bf1, Bf2, Bf3 and Bf4 created as above described.

As shown in FIG. 5 the SQUID sensors 28a, 28b, 28c and 28d are positioned in an evacuated cavity 48 sealed by a protective window 49 that is transparent to the pulsating magnetic fields. Port 50 is used to evacuate the cavity 48 and electrical leads 29a, 29b, 29c and 29d, as shown in FIGS. 3 and 5, lead from each respective sensor to the lock-in amplifier 30.

FIG. 6 is a sectional view of a schematically illustrated test arrangement designed to measure, in accordance with the present invention, the currents in a chip 50 under various test conditions. Here a chip 50 has been designed and provided with the necessary magnetic field concentrators, Hall converters, amplifiers and etc. as described in conjunction with FIG. 1 of the present invention. The chip 50 is then mounted such that its active face 52 is mounted against a wiring substrate, as is well known to the art. When so mounted the chip can be electrically activated though the substrate and subjected to various selected tests as is well known to the art. By employing the present invention circuit in selected portions of such substrate mounted chips can be measured by placing the back or inactive face 55 of the chip 50 in contact with a remote sensor arrangement 56, designed for the chip under test, and measuring, as above described, the actual currents in selected portions of the powered up chip.

The present invention thus teaches a simple, inexpensive and automatic way of measuring with great accuracy the actual currents in a semiconductor chip under various operating conditions.

This completes the description of the preferred embodiment of the invention. Since changes may be made in the above construction without departing from the scope of the invention described herein, it is intended that all the matter contained in the above description or shown in the accompanying drawings shall be interpreted as illustrative and not in a limiting sense.

Other alternatives and modifications will now become apparent to those skilled in the art without departing from the spirit and scope of the invention as set forth in the following claims.

The invention claimed is:

1. A system for remotely measuring signals in a circuit under test comprising:
    means for establishing a first signal in a first selected current path in said circuit;
    means for establishing a first focused magnetic field at a selected position in said first current path;
    means for converting said first focused magnetic field into a first Hall voltage;
    means for transmitting said first Hall voltage to a first frequency gated amplifier;
    means for gating said amplifier with a first selected signal having a first selected frequency; to modulate, in the amplifier, the converted Hall voltage to provide, at the output of said first amplifier, a second current pulsating at the frequency of said first selected signal;
    means for transmitting said pulsating flow of current pulses through a second current path to establish in said second current path a second focused magnetic field pulsing at the frequency of said first signal; and,
    remote magnetic sensing means for detecting said pulsating magnetic field and for providing a electrical output directly proportional to the current in said first path.

2. The system of claim 1 wherein said remote magnetic sensing means is a superconducting quantum interference device.

3. The system of claim 2 the output of said superconducting quantum interference device is coupled to a lock-in amplifier synchronized to the respective frequency pulsing the sensed magnetic field transmitters.

4. A method of remotely detecting and establishing the value of currents in circuits in an integrated semiconductor device comprising the steps of:
    selecting an integrated semiconductor device;
    applying a voltage to a first selected circuit in said device to establish a first quiescent current in a selected portion of said first selected circuit;
    sensing said first quiescent current in said selected portion of said first selected circuit, converting said sensed first quiescent current in said first selected circuit to a first Hall voltage with a first magnetic field concentrator and a first Hall sensor, amplifying said first Hall voltage;

modulating said amplified first Hall voltage with a first known frequency, converting said amplified and modulated first Hall voltage with a second magnetic field concentrator to create a first magnetic field pulsing at said known first frequency; and detecting said pulsating first magnetic field with a first remote sensor to provide an output signal proportional to said first sensed current.

5. The method of claim 4 wherein there is further included the steps of:

applying a voltage to a second selected circuit in said device to establish a second quiescent current in a selected portion of said second selected circuit;

sensing said second quiescent current in said selected portion of said second selected circuit, converting said sensed second quiescent current in said second selected circuit to a second Hall voltage with a third magnetic field concentrator and a second Hall sensor, amplifying said second Hall voltage;

modulating said amplified second Hall voltage with a second known frequency, converting said amplified and modulated second Hall voltage with a fourth magnetic field concentrator to create a second magnetic field pulsing at said known second frequency; and detecting said pulsating second magnetic field with a second remote sensor to provide an output signal proportional to said second sensed current.

6. The method of claim 4 wherein there is further included the steps of:

applying a selected voltage to a second selected circuit in said chip to establish a current therein;

directing said current in said second circuit through a third magnetic field concentrator to establish a steady state magnetic field;

converting said second magnetic field into a third voltage applying a second frequency to said third voltage to modulate said third voltage;

creating from said third modulated voltage a second pulsating magnetic field that is pulsating at said second frequency;

measuring said second pulsating magnetic field with a second remote sensor to convert said second pulsating magnetic field into an output signal proportional to said current in said second selected integrated circuit;

applying the output signal of the first remote sensor and the output signal of the second remote sensor to a lock-in amplifier and synchronizing the output signal of said first remote sensor with said first frequency and synchronizing the output signal of said second remote sensor with said second frequency to provide at the output of the lock-in amplifier analog current information from each sensing location without crosstalk between the sensing circuits and without noise in the form of stray extraneous magnetic fields and other induced errors in the tested circuit.

7. A semiconductor testing apparatus comprising:

means for holding a semiconductor device to be tested;

means for applying an electrical signal to the semiconductor device to be tested to induce in said device a current through a selected path in said device means for establishing a current in a selected current path in said circuit;

means for establishing a focused magnetic field at a selected position in said current path;

means for converting said focused magnetic field into a Hall voltage;

means for transmitting said Hall voltage to a second gated amplifier;

means for gating said amplifier with a selected signal with a selected frequency; to modulate, in the amplifier, the converted Hall voltage to provide, at the output of said amplifier, a current pulsating at the frequency of said selected signal;

means for transmitting said pulsating current pulses through a current path to establish in said current path a focused magnetic field pulsing at the frequency of said signal; and, remote magnetic sensing means for detecting said pulsating magnetic field and for providing a electrical output proportional to the current in said path.

* * * * *